United States Patent
Jo

(10) Patent No.: US 11,209,470 B2
(45) Date of Patent: Dec. 28, 2021

(54) SYSTEM AND METHOD FOR MEASURING INSULATION RESISTANCE

(71) Applicant: LG Chem, Ltd., Seoul (KR)

(72) Inventor: Lyang Wook Jo, Daejeon (KR)

(73) Assignee: LG Chem, Ltd.

( * ) Notice: Subject to any disclaimer, the term of this patent is extended or adjusted under 35 U.S.C. 154(b) by 96 days.

(21) Appl. No.: 16/675,434

(22) Filed: Nov. 6, 2019

(65) Prior Publication Data

US 2020/0141987 A1 May 7, 2020

(30) Foreign Application Priority Data

Nov. 7, 2018 (KR) .......................... 10-2018-0135991

(51) Int. Cl.
| | | |
|---|---|---|
| *G01R 27/02* | (2006.01) | |
| *B60L 3/00* | (2019.01) | |
| *G01R 31/00* | (2006.01) | |
| *G01R 31/50* | (2020.01) | |

(52) U.S. Cl.
CPC .......... *G01R 27/025* (2013.01); *B60L 3/0069* (2013.01); *G01R 31/006* (2013.01); *G01R 31/50* (2020.01)

(58) Field of Classification Search
None
See application file for complete search history.

(56) References Cited

U.S. PATENT DOCUMENTS

| | | |
|---|---|---|
| 8,373,950 B2 | 2/2013 | Yano et al. |
| 9,341,667 B2 | 5/2016 | Palmieri et al. |
| 2015/0084551 A1* | 3/2015 | Hayashi ................ H02M 7/539 318/8 |
| 2019/0242933 A1 | 8/2019 | Sung et al. |

FOREIGN PATENT DOCUMENTS

| | | |
|---|---|---|
| JP | 2010239822 A | 10/2010 |
| JP | 2013140034 A | 7/2013 |
| JP | 6321007 B2 | 5/2018 |
| KR | 20140062531 A | 5/2014 |
| KR | 20180051948 A | 5/2018 |
| KR | 20180086983 A | 8/2018 |

* cited by examiner

*Primary Examiner* — Jas A Sanghera

(74) *Attorney, Agent, or Firm* — Lerner, David, Littenberg, Krumholz & Mentlik, LLP

(57) ABSTRACT

The present invention relates to a system and a method of measuring insulation resistance, which separate a region in which insulation resistance is positioned by installing a device performing a function equivalent to a relay on a path in which insulation resistance of an electric vehicle is measured and measure an insulation resistance value for each region, to recognize a region in which insulation resistance breakdown occurs when breakdown of insulation resistance occurs.

16 Claims, 4 Drawing Sheets

[Figure 1]
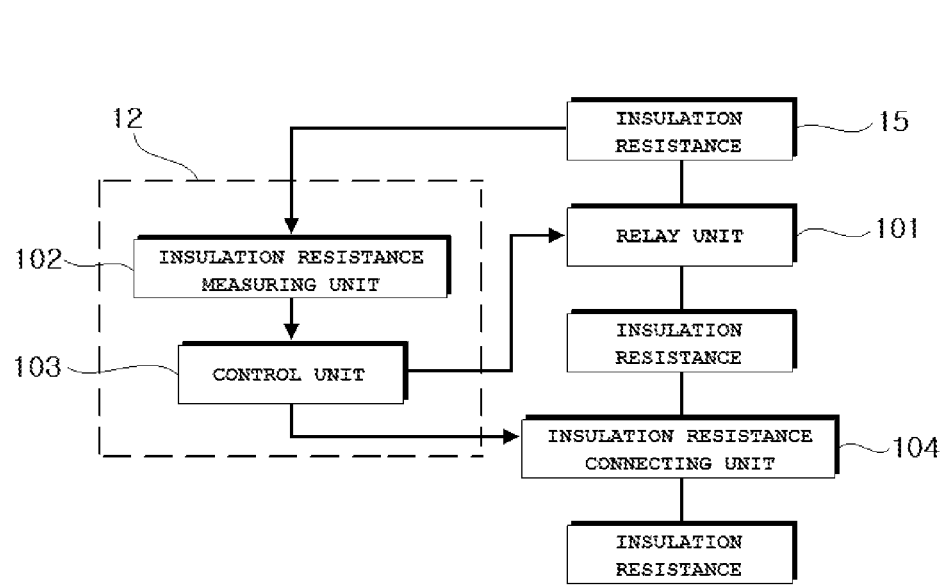
[Figure 2]
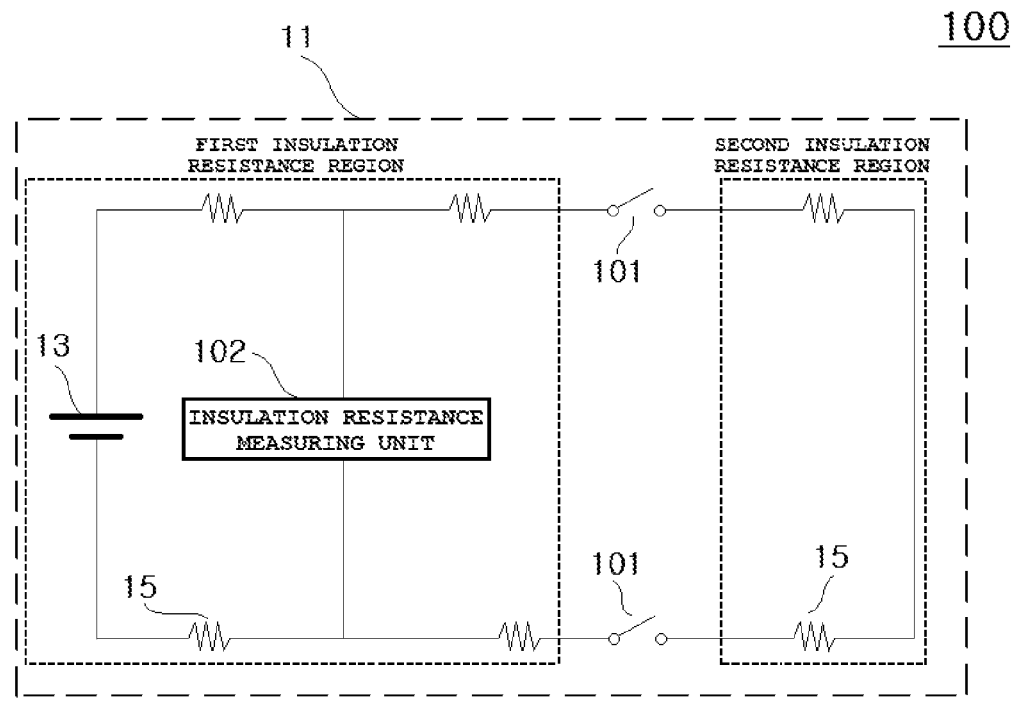

[Figure 3]
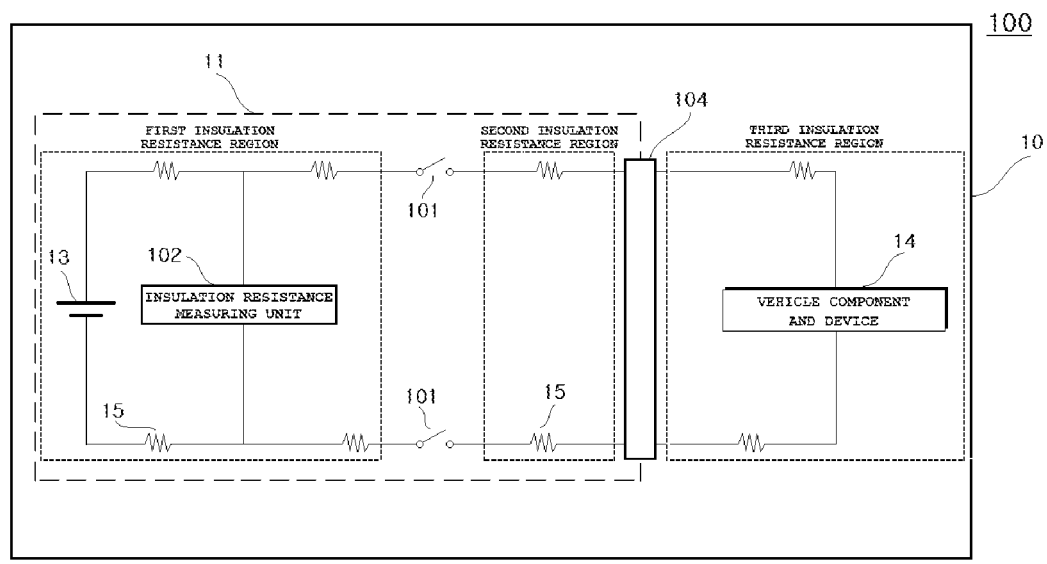

[Figure 4]
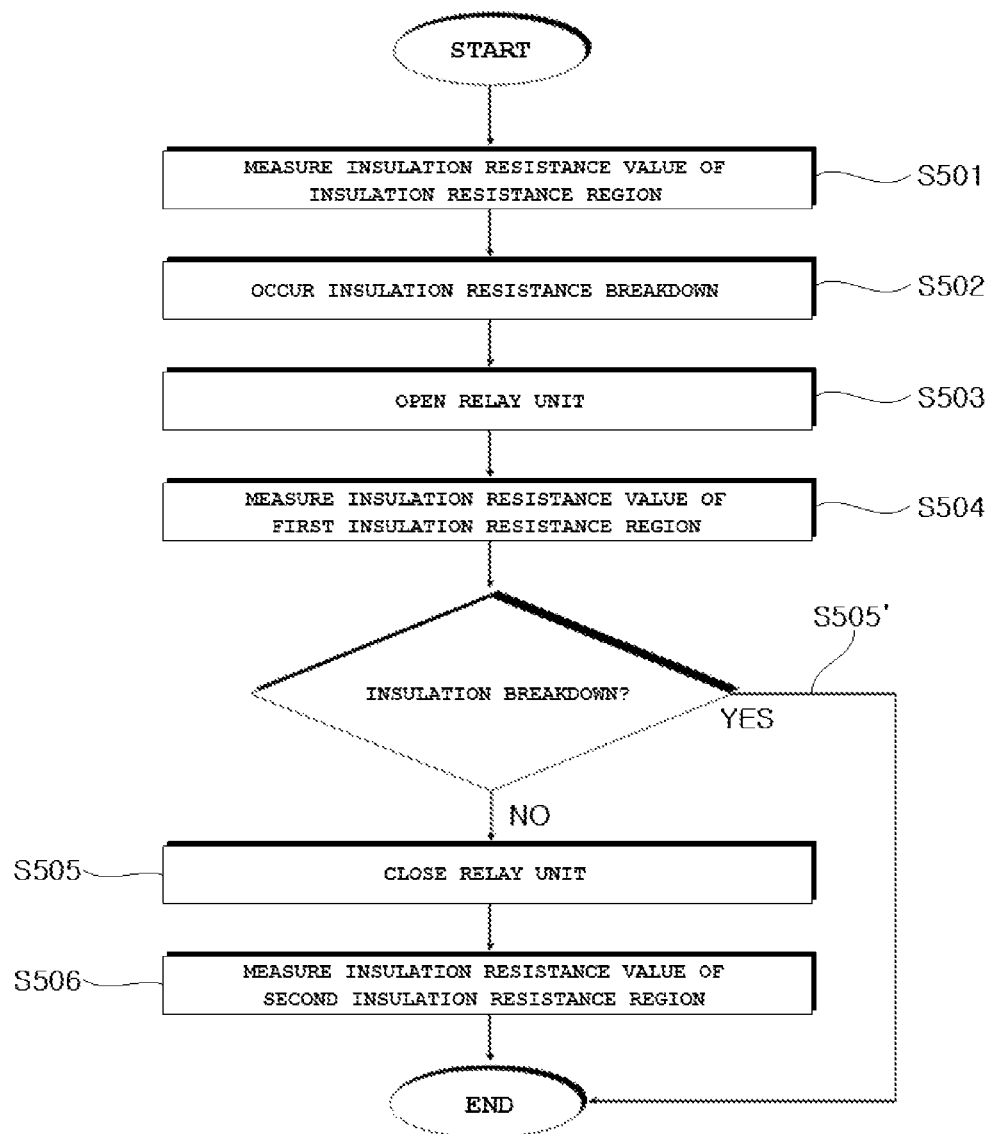

[Figure 5]
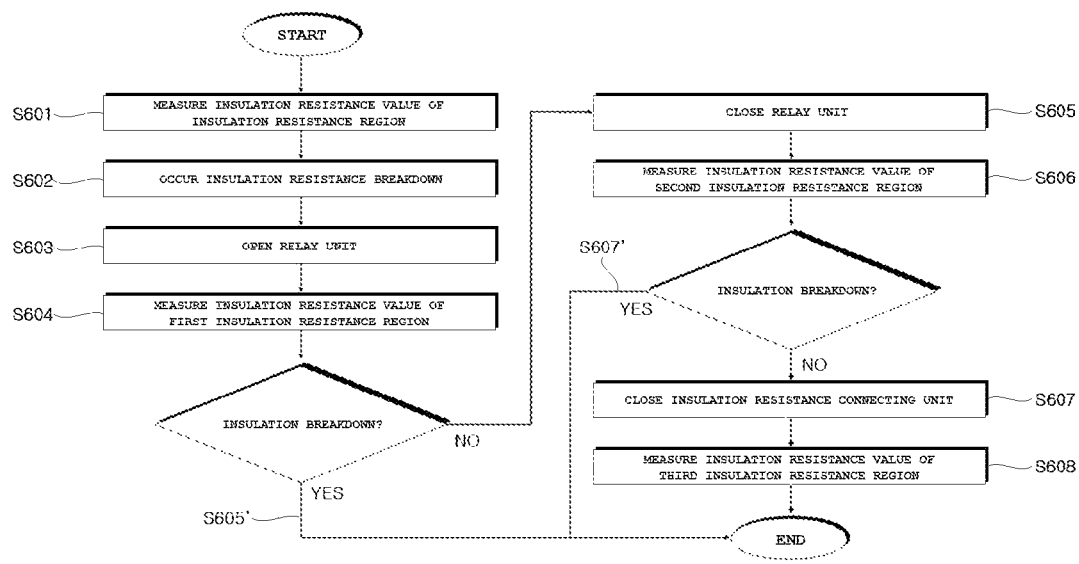

SYSTEM AND METHOD FOR MEASURING INSULATION RESISTANCE

CROSS-REFERENCE TO RELATED APPLICATIONS

This application claims priority to and the benefit of Korean Patent Application No. 10-2018-0135991 filed in the Korean Intellectual Property Office on Nov. 7, 2018, the entire contents of which are incorporated herein by reference.

TECHNICAL FIELD

The present invention relates to a system and a method of measuring insulation resistance, and more particularly, to a system and a method of measuring insulation resistance, which separate a region in which insulation resistance is positioned by installing a device performing a function equivalent to a relay on a path in which insulation resistance of an electric vehicle is measured and measure an insulation resistance value for each region, to recognize a region in which insulation resistance breakdown occurs when breakdown of insulation resistance occurs.

BACKGROUND ART

In a battery applied to an electric vehicle, an energy storage source, and the like, a plurality of unit secondary battery cells is typically used in the form of an assembly to make a high-voltage environment, which may not be necessarily applied to a secondary battery which is implemented as a battery of a portable terminal and the like.

In a vehicle equipped with a high-voltage battery, it is important to maintain sufficient insulation from an external device, and in a poor insulation situation, leakage current occurs to cause malfunctions and failures of various electronic devices and create a dangerous environment to a driver and a passenger of a vehicle.

In order to prevent the foregoing dangerous situation, there exists a separate circuit measuring insulation resistance, but it is impossible to additionally determine a region inside a vehicle in which a problem occurs, except for diagnosing a problem of insulation resistance of a vehicle, so that there is a problem in that repair efficiency of the vehicle is reduced.

RELATED ART LITERATURE

Patent Document

Japanese Patent Application Laid-Open No. 2013-140034

SUMMARY OF THE INVENTION

The present invention has been made in an effort to provide a system and a method of measuring insulation resistance, which separate a region in which insulation resistance is positioned by installing a device performing a function equivalent to a relay on a path in which insulation resistance is measured and measure an insulation resistance value for each region, to detect insulation resistance breakdown and recognize a region in which insulation resistance breakdown occurs when breakdown of insulation resistance occurs and make it easy to repair a vehicle and replace a component.

An exemplary embodiment of the present invention provides a system for measuring insulation resistance, the system including: a relay unit configured to connect or separate a first insulation resistance region and a second insulation resistance region among insulation resistance regions including insulation resistances according to an operation state; an insulation resistance measuring unit configured to measure an insulation resistance value for one or more insulation resistance regions among the insulation resistance regions according to a connection state between the insulation resistance regions; and a control unit configured to determine whether insulation breakdown occurs in the insulation resistance region based on the insulation resistance value received from the insulation resistance measuring unit, and determine a region, in which the insulation breakdown occurs, among the insulation resistance regions by controlling an operation of the relay unit.

In the exemplary embodiment, the system may further include an insulation resistance connecting unit configured to connect or separate a third insulation resistance region among the insulation resistance regions to or from the second insulation resistance region according to an operation state, in which the control unit may determine whether insulation breakdown occurs in the insulation resistance region based on the insulation resistance value received from the insulation resistance measuring unit, and determine a region, in which the insulation breakdown occurs, among the insulation resistance regions by controlling operations of the relay unit and the insulation resistance connecting unit.

In the exemplary embodiment, the insulation resistance region may be included inside a battery pack, and include a circuit and a device connected to the insulation resistance measuring unit and a front end of the relay unit.

In the exemplary embodiment, the second insulation resistance region may be included inside the battery pack, and include a circuit and a device in a path connected from a rear end of the relay unit to the insulation resistance connecting unit.

In the exemplary embodiment, the third insulation resistance region may include a circuit and a device connected from the outside of the battery pack to the insulation resistance connecting unit.

In the exemplary embodiment, the insulation resistance connecting unit may be located in a boundary between an inside and an outside of the battery pack while being adjacent to a case of the battery pack.

In the exemplary embodiment, the control unit may connect all of the insulation resistance regions by controlling the relay unit and the insulation resistance connecting unit until it is determined that the insulation breakdown occurs in one or more insulation resistance regions among the insulation resistance regions.

In the exemplary embodiment, when it is determined that the insulation breakdown occurs in one or more insulation resistance regions among the insulation resistance regions, the control unit may separate the first insulation resistance region and the second insulation resistance region by controlling the relay unit, receive the insulation resistance value for the first insulation resistance region from the insulation resistance measuring unit, and determine whether the insulation breakdown occurs in the first insulation resistance region.

In the exemplary embodiment, when it is determined that the insulation breakdown does not occur in the first insulation resistance region, the control unit may connect the first insulation resistance region and the second insulation resistance region by controlling the relay unit and the insulation resistance connecting unit, separate the third insulation resistance region and the second insulation resistance region, receive the insulation resistance values for the first insulation resistance region and the second insulation resistance region from the insulation resistance measuring unit, and determine whether the insulation breakdown occurs in the second insulation resistance region.

In the exemplary embodiment, when it is determined that the insulation breakdown does not occur in the second insulation resistance region, the control unit may connect the first insulation resistance region, the second insulation resistance region, and the third insulation resistance region by controlling the relay unit and the insulation resistance connecting unit, receive the insulation resistance values for the entire insulation resistance regions from the insulation resistance measuring unit, and determine whether the insulation breakdown occurs in the third insulation resistance region.

In the exemplary embodiment, the control unit may provide a separate external output device with information about a region in which the insulation breakdown occurs.

Another exemplary embodiment of the present invention provides a battery management system, including: an insulation resistance measuring unit configured to measure an insulation resistance value for one or more insulation resistance regions according to a connection state between the one or more insulation resistance regions including insulation resistances; and a control unit configured to determine whether insulation breakdown occurs in the one or more insulation resistance regions based on the insulation resistance value received from the insulation resistance measuring unit, and determine a region, in which the insulation breakdown occurs, among the one or more insulation resistance regions by controlling a connection state between the one or more insulation resistance regions.

Another exemplary embodiment of the present invention provides a method of measuring insulation resistance, the method including: connecting or separating, through a relay unit, a first insulation resistance region and a second insulation resistance region among insulation resistance regions including insulation resistances according to an operation state; measuring, through an insulation resistance measuring unit, an insulation resistance value for one or more insulation resistance regions among the insulation resistance regions according to a connection state between the insulation resistance regions; and determining, through a control unit, whether insulation breakdown occurs in the insulation resistance region based on the insulation resistance value received from the insulation resistance measuring unit, and determining a region, in which the insulation breakdown occurs, among the insulation resistance regions by controlling an operation of the relay unit.

In the exemplary embodiment, the method may further include connecting or separating, by an insulation resistance connecting unit, a third insulation resistance region among the insulation resistance regions to or from the second insulation resistance region according to an operation state, in which the determining of, through the control unit, whether insulation breakdown occurs in the insulation resistance region based on the insulation resistance value received from the insulation resistance measuring unit, and the determining of the region, in which the insulation breakdown occurs, among the insulation resistance regions by controlling the operation of the relay unit may include determining whether insulation breakdown occurs in the insulation resistance region based on the insulation resistance value received from the insulation resistance measuring unit, and determining a region, in which the insulation breakdown occurs, among the insulation resistance regions by controlling operations of the relay unit and the insulation resistance connecting unit.

In the exemplary embodiment, the determining of whether insulation breakdown occurs in the insulation resistance region based on the insulation resistance value received from the insulation resistance measuring unit, and determining of the region, in which the insulation breakdown occurs, among the insulation resistance regions by controlling operations of the relay unit and the insulation resistance connecting unit may include connecting all of the insulation resistance regions by controlling the relay unit and the insulation resistance connecting unit until it is determined that the insulation breakdown occurs in one or more insulation resistance regions among the insulation resistance regions.

In the exemplary embodiment, the determining of, through the control unit, whether insulation breakdown occurs in the insulation resistance region based on the insulation resistance value received from the insulation resistance measuring unit, and the determining of the region, in which the insulation breakdown occurs, among the insulation resistance regions by controlling the operation of the relay unit may include, when it is determined that the insulation breakdown occurs in one or more insulation resistance regions among the insulation resistance regions, separating the first insulation resistance region and the second insulation resistance region by controlling the relay unit, receiving the insulation resistance value for the first insulation resistance region from the insulation resistance measuring unit, and determining whether the insulation breakdown occurs in the first insulation resistance region.

In the exemplary embodiment, the determining of, through the control unit, whether insulation breakdown occurs in the insulation resistance region based on the insulation resistance value received from the insulation resistance measuring unit, and the determining of the region, in which the insulation breakdown occurs, among the insulation resistance regions by controlling the operation of the relay unit may include, when it is determined that the insulation breakdown does not occur in the first insulation resistance region, connecting the first insulation resistance region and the second insulation resistance region by controlling the relay unit and the insulation resistance connecting unit, separating the third insulation resistance region and the second insulation resistance region, receiving the insulation resistance values for the first insulation resistance region and the second insulation resistance region from the insulation resistance measuring unit, and determining whether the insulation breakdown occurs in the second insulation resistance region.

In the exemplary embodiment, the determining of, through the control unit, whether insulation breakdown occurs in the insulation resistance region based on the insulation resistance value received from the insulation resistance measuring unit, and the determining of the region, in which the insulation breakdown occurs, among the insulation resistance regions by controlling the operation of the relay unit may include, when it is determined that the insulation breakdown does not occur in the second insulation resistance region, connecting the first insulation resistance region, the second insulation resistance region, and the third insulation resistance region by controlling the relay unit and the insulation resistance connecting unit, receiving the insulation resistance values for the entire insulation resistance regions from the insulation resistance measuring unit, and determining whether the insulation breakdown occurs in the third insulation resistance region.

The system and the method of measuring insulation resistance according to the exemplary embodiment of the present invention separate a region in which insulation resistance is positioned by installing a device performing a function equivalent to a relay on a path in which insulation resistance is measured and measure an insulation resistance value for each region, to detect insulation resistance breakdown and recognize a region in which insulation resistance breakdown occurs when breakdown of insulation resistance occurs and make it easy to repair a vehicle and replace a component.

BRIEF DESCRIPTION OF THE DRAWINGS

FIG. 1 is a diagram illustrating a configuration of an insulation resistance measuring system 100 according to an exemplary embodiment of the present invention.

FIG. 2 is a diagram illustrating a form of the insulation resistance measuring system 100 according to the exemplary embodiment of the present invention.

FIG. 3 is a diagram illustrating another form of the insulation resistance measuring system 100 according to the exemplary embodiment of the present invention.

FIG. 4 is a flowchart for describing a process of measuring insulation resistance through the insulation resistance measuring system 100 according to the exemplary embodiment of FIG. 2.

FIG. 5 is a flowchart for describing a process of measuring insulation resistance through the insulation resistance measuring system 100 according to the exemplary embodiment of FIG. 3.

DETAILED DESCRIPTION

The present invention will be described in detail with reference to the accompanying drawings. Herein, repeated descriptions, and detailed descriptions of publicly known function and configuration which may unnecessarily make the main point of the present invention be unclear will be omitted. The exemplary embodiment of the present invention is provided for more completely explaining the present invention to those skilled in the art. Accordingly, shapes, sizes, and the like of the elements in the drawing may be exaggerated for a clearer description.

In the entire specification, unless explicitly described to the contrary, when it is said that a part "comprises/includes" a constituent element, this means that another constituent element may be further "included/comprised" not that another constituent element is excluded.

A term "unit" described in the specification means a unit of processing one or more functions or operations, and the "unit" may be implemented by hardware, software, or a combination of hardware and software.

In an insulation resistance measuring system in the related art, a battery management system measures insulation resistance values of a plurality of insulation resistances connected with a battery power source of an electric vehicle and components and devices of the vehicle, which may be determined as kinds of the insulation resistance to recognize an abnormal state of the insulation resistance.

The insulation resistance measuring system in the related art is capable of diagnosing insulation breakdown occurring in an insulation resistance of an electric vehicle, but has a problem in that it is impossible to additionally determine a region inside the electric vehicle in which insulation breakdown occurs.

FIG. 1 is a diagram illustrating a configuration of an insulation resistance measuring system 100 according to an exemplary embodiment of the present invention, FIG. 2 is a diagram illustrating a basic form of the insulation resistance measuring system 100 according to the exemplary embodiment of the present invention, and FIG. 3 is a diagram illustrating an additional form of the insulation resistance measuring system 100 according to the exemplary embodiment of the present invention.

Referring to FIGS. 1 to 3, the insulation resistance measuring system 100 according to the exemplary embodiment of the present invention may generally include a relay unit 101, an insulation resistance measuring unit 102, and a control unit 103. Further, in the exemplary embodiment, the insulation resistance measuring system 100 may additionally include an insulation resistance connecting unit 104.

The insulation resistance measuring system 100 illustrated in FIGS. 1 to 3 is based on the exemplary embodiment, and the constituent elements thereof are not limited to the exemplary embodiment illustrated in FIGS. 1 to 3, and some constituent elements may be added, changed, or deleted as necessary.

First, the relay unit 101 may connect or separate a first insulation resistance region and a second insulation resistance region among the insulation resistance regions including insulation resistances 15 according to an operation state.

Herein, the relay unit 101 may mean or include a device including a sort of switch function, that is, a device performing a function equivalent to electrically connecting or separating a circuit or a device connected to a front end and a rear end according to a closed state or an opened state.

The first insulation resistance region may be a region included inside a battery pack 11 and including a circuit and a device connected to the insulation resistance measuring unit 102 and a front end of the relay unit 101.

The second insulation resistance region may be a region included inside the battery pack 11 and including a circuit and a device between a path connected from a rear end of the relay unit 101 to the insulation resistance connecting unit 104 which is to be described below.

Next, the insulation resistance measuring unit 102 may measure an insulation resistance value for one or more insulation resistance regions according to a connection state between the insulation resistance regions.

Herein, the third insulation resistance region may be a region including a circuit and a device connected from the outside of the battery pack 11 to the insulation resistance connecting unit 104 which is to be described below.

The circuit and the device connected to the insulation resistance connecting unit 104 may be included in the third insulation resistance region as illustrated in FIG. 4, and may include an electronic device operating in a high-voltage region inside the vehicle.

Next, the control unit 103 may determine whether insulation breakdown occurs in the insulation resistance region based on the insulation resistance value received from the insulation resistance measuring unit 102, and determine a region, in which insulation breakdown occurs, among the insulation resistance regions by controlling an operation of the relay unit 101.

Herein, the operation of the relay unit 101 may mean an opened state or a closed state in which the relay unit 101 is capable of connecting or separating respective insulation resistance regions connected by both ends (the front end and the rear end) of the relay unit 101.

The insulation resistance measuring unit 102 and the control unit 103 may be included inside a battery management system 12.

The insulation resistance connecting unit 104 may connect or separate the third insulation resistance region among the insulation resistance regions to or from the second insulation resistance region according to the operation state Herein, the insulation resistance connecting unit may be adjacent to a case of the battery pack 11 to be located in a boundary between the inside and the outside of the battery pack 11.

The insulation resistance connecting unit 104 serves to connect the battery pack 11 of the electric vehicle 10 and vehicle components and devices 14 to supply a battery power source 13 included inside the battery pack 11 to the vehicle components and devices 14 outside the battery pack 11.

The insulation resistance connecting unit 104 may include a device equivalent or identical to the foregoing relay unit 101 inside thereof to connect or separate respective insulation resistance regions located in opposite directions, and may physically connect or separate electronic devices included in the vehicle components and devices 14 as the kinds of socket.

The control unit 103 may determine whether insulation breakdown occurs in the insulation resistance region based on the insulation resistance value received from the insulation resistance measuring unit 102, and determine a region, in which the insulation breakdown occurs, among the insulation resistance regions by controlling the operations of the relay unit 101 and the insulation resistance connecting unit 104 which is to be described below.

The control unit 103 may connect all of the insulation resistance regions by controlling the relay unit 101 and the insulation resistance connecting unit 104 until it is determined that the insulation breakdown occurs in one or more insulation resistance regions among the insulation resistance regions.

In the exemplary embodiment of FIG. 2, when it is determined that the insulation breakdown occurs in one or more insulation resistance regions among the insulation resistance regions, the control unit 103 may separate the first insulation resistance region and the second insulation resistance region by controlling the relay unit 101, receive the insulation resistance value for the first insulation resistance region from the insulation resistance measuring unit 102 and determine whether the insulation breakdown occurs in the first insulation resistance region.

In the exemplary embodiment of FIG. 2, when it is determined that the insulation breakdown does not occur in the first insulation resistance region, the control unit 103 may connect the first insulation resistance region and the second insulation resistance region by controlling the relay unit 101 and the insulation resistance connecting unit 104, separate the third insulation resistance region and the second insulation resistance region, receive the insulation resistance values for the first insulation resistance region and the second insulation resistance region from the insulation resistance measuring unit, and determine whether the insulation breakdown occurs in the second insulation resistance region.

When the foregoing method is applied, it is possible to more specifically recognize an insulation breakdown occurring point by configuring the insulation resistance region inside the battery pack 11 of the electric vehicle 10 with two or more regions and further segmenting the insulation resistance regions.

In the exemplary embodiment of FIG. 3, when it is determined that the insulation breakdown does not occur in the second insulation resistance region, the control unit 103 may connect the first insulation resistance region, the second insulation resistance region, and the third insulation resistance region by controlling the relay unit 101 and the insulation resistance connecting unit 104, receive the insulation resistance values for the entire insulation resistance regions from the insulation resistance measuring unit 102, and determine whether the insulation breakdown occurs in the third insulation resistance region.

As illustrated in FIG. 3, if a region corresponding to the outside of the battery pack 11 of the electric vehicle 10 may be connected with the battery management system 12, the region may be added to the present invention as the region, in which insulation resistance may be measured, and thus the insulation resistance region may be segmented and managed.

The control unit 103 may provide information about the region in which the insulation breakdown occurs to a separate external output device.

Herein, the separate external output device may include a display device, which is mounted to the electric vehicle 10 and outputs information about the insulation breakdown received from the control unit 103 for the purpose of providing a driver or a person concerned of a vehicle with visual information for the insulation breakdown, an alarm device, which is mounted to the electric vehicle 10 and outputs information about the insulation breakdown received from the control unit 103 for the purpose of providing a driver or a person concerned of a vehicle with auditory information for the insulation breakdown, and the like.

Next, a process of measuring insulation resistance through the insulation resistance measuring system 100 will be described with reference to FIG. 4.

FIG. 4 is a flowchart for describing a process of measuring insulation resistance through the insulation resistance measuring system according to the exemplary embodiment of FIG. 2.

Referring to FIG. 4, first, the insulation resistance measuring unit inside the battery management system measures insulation resistance values for the entire insulation resistance regions (S501).

When insulation resistance breakdown occurs in a specific part of the insulation resistance region (S502), the control unit separates a first insulation resistance region and a second insulation resistance region by controlling a state of the relay unit to an opened state (S503), and the insulation resistance measuring unit measures an insulation resistance value for the first insulation resistance region and provides the control unit with the measured insulation resistance value (S504).

Herein, when it is determined that the insulation breakdown occurs in the first insulation resistance region, the control unit provides an external output device and the like with information about the insulation breakdown and terminates the system (S505').

When the insulation breakdown does not occur in the first insulation resistance region, the control unit connects the first insulation resistance region and the second insulation resistance region by controlling the state of the relay unit to a closed state (S505), and the insulation resistance measuring unit additionally measures an insulation resistance value for the second insulation resistance region and provides the control unit with the measured insulation resistance value (S506).

Herein, when it is determined that the insulation breakdown occurs in the second insulation resistance region, the control unit provides an external output device and the like with the information about the insulation breakdown and terminates the system.

Next, a process of measuring insulation resistance through the insulation resistance measuring system 100 in another exemplary embodiment will be described with reference to FIG. 5.

FIG. 5 is a flowchart for describing a process of measuring insulation resistance through the insulation resistance measuring system 100 according to the exemplary embodiment of FIG. 3.

Referring to FIG. 5, first, the insulation resistance measuring unit inside the battery management system measures insulation resistance values for the entire insulation resistance regions (S601).

When insulation resistance breakdown occurs in a specific part of the insulation resistance region (S602), the control unit separates a first insulation resistance region and a second insulation resistance region by controlling a state of the relay unit to an opened state (S603), and the insulation resistance measuring unit measures an insulation resistance value for the first insulation resistance region and provides the control unit with the measured insulation resistance value (S604).

Herein, when it is determined that the insulation resistance breakdown occurs in the first insulation resistance region, the control unit provides an external output device and the like with information about the insulation breakdown and terminates the system (S605').

When the insulation breakdown does not occur in the first insulation resistance region, the control unit connects the first insulation resistance region and the second insulation resistance region by controlling the state of the relay unit to a closed state (S605), and the insulation resistance measuring unit additionally measures an insulation resistance value for the second insulation resistance region and provides the control unit with the measured insulation resistance value (S606).

Herein, when it is determined that the insulation resistance breakdown occurs in the second insulation resistance region, the control unit provides an external output device and the like with information about the insulation breakdown and terminates the system (S607').

When the insulation breakdown does not occur in the second insulation resistance region, the control unit connects the second insulation resistance region and the third insulation resistance region by additionally controlling the state of the insulation resistance connecting unit to the closed state (S607), and the insulation resistance measuring unit additionally measures an insulation resistance value for the third insulation resistance region and provides the control unit with the measured insulation resistance value (S608).

Herein, when it is determined that the insulation breakdown occurs in the third insulation resistance region, the control unit provides an external output device and the like with the information about the insulation breakdown and terminates the system.

The foregoing insulation resistance measuring method has been described with reference to the flowchart presented in the drawing. For the simple description, the method is illustrated and described with the series of blocks, but the present invention is not limited to the order of the blocks, and some blocks may occur in the different order from the order illustrated and described in the present specification or may occur with other blocks at the same time, and various other branches, a flow path, and orders of the blocks achieving the same or similar result may be implemented. Further, for the implementation of the method described in the present specification, all of the illustrated blocks may not be required.

In the forgoing, the present invention has been described with reference to the exemplary embodiment of the present invention, but those skilled in the art may appreciate that the present invention may be variously corrected and changed within the range without departing from the spirit and the area of the present invention described in the appending claims.

What is claimed is:

1. A system for measuring insulation resistance, the system comprising:
   a relay unit configured to connect or separate a first insulation resistance region and a second insulation resistance region among a plurality of insulation resistance regions;
   an insulation resistance measuring unit configured to measure an insulation resistance value of the connected first and second insulation resistance regions, an insulation resistance value of the first insulation resistance region separate from the second insulation resistance region, and an insulation resistance value of the second insulation resistance region separate from the first insulation resistance region; and
   a control unit configured to:
      receive the insulation resistance value of the connected first and second insulation resistance regions from the insulation resistance measuring unit;
      in response to detection of an insulation breakdown in the connected first and second insulation resistance regions based on the insulation resistance value of the connected first and second insulation resistance regions:
         control the relay unit to separate the first insulation resistance region from the second insulation resistance region;
         receive the insulation resistance value of at least one of the separated first and second insulation resistance regions from the insulation resistance measuring unit; and
         determine in which of the first or second insulation resistance regions the insulation breakdown occurs.

2. The system of claim 1, further comprising:
   an insulation resistance connecting unit configured to connect or separate the second insulation region and a third insulation resistance region among the plurality of insulation resistance regions,
   wherein the control unit, in response to detection of an insulation breakdown in the plurality of insulation resistance regions based on one or more insulation resistance values received from the insulation resistance measuring unit, is configured to determine in which of the first, second or third insulation resistance regions the insulation breakdown occurs.

3. The system of claim 2, wherein the second insulation resistance region is a region included inside a battery pack, and including a circuit and a device in a path connected from a rear end of the relay unit to the insulation resistance connecting unit, and wherein the third insulation resistance region includes a circuit and a device connected from the outside of the battery pack to the insulation resistance connecting unit.

4. The system of claim 2, wherein the second insulation resistance region is a region included inside a battery pack, and including a circuit and a device in a path connected from a rear end of the relay unit to the insulation resistance connecting unit, and wherein the insulation resistance connecting unit is located in a boundary between an inside and an outside of the battery pack while being adjacent to a case of the battery pack.

5. The system of claim 2, wherein the control unit is configured to connect the plurality of insulation resistance regions to one another by controlling the relay unit and the insulation resistance connecting unit until it is determined in which of the plurality of insulation resistance regions the insulation breakdown occurs.

6. The system of claim 2, wherein in response to detection of an insulation breakdown in the plurality of insulation resistance regions based on one or more insulation resistance values received from the insulation resistance measuring unit, the control unit is further configured to:
 connect the first insulation resistance region and the second insulation resistance region by controlling the relay unit,
 separate the third insulation resistance region and the second insulation resistance region by controlling the insulation resistance connecting unit,
 receive the insulation resistance values for the first insulation resistance region and the second insulation resistance region from the insulation resistance measuring unit, and
 determine whether the insulation breakdown occurs in the second insulation resistance region based on the insulation resistance values for the first insulation resistance region and the second insulation resistance region.

7. The system of claim 6, wherein in response to a determination that the insulation breakdown does not occur in the second insulation resistance region, the control unit is further configured to:
 connect the first insulation resistance region, the second insulation resistance region, and the third insulation resistance region to one another by controlling the relay unit and the insulation resistance connecting unit,
 receive the insulation resistance value for the connected first, second and third insulation resistance regions from the insulation resistance measuring unit, and
 determine whether the insulation breakdown occurs in the third insulation resistance region based on the insulation resistance value for the connected first, second and third insulation resistance regions.

8. The system of claim 1, wherein the first insulation resistance region is a region included inside a battery pack and including a circuit and a device connected to the insulation resistance measuring unit and a front end of the relay unit.

9. The system of claim 1, wherein the second insulation resistance region is a region included inside a battery pack, and including a circuit and a device in a path connected from a rear end of the relay unit to the insulation resistance connecting unit.

10. The system of claim 1, wherein the control unit is configured to provide a separate external output device with information about in which region the insulation breakdown occurs.

11. A battery management system, comprising:
 an insulation resistance measuring unit configured to measure insulation resistance values of a plurality of insulation resistance regions separately or connected to one another; and
 a control unit configured to:
  receive an insulation resistance value of connected first and second insulation resistance regions from the insulation resistance measuring unit;
  in response to detection of an insulation breakdown in the connected first and second insulation resistance regions based on the insulation resistance value of the connected first and second insulation resistance regions,
   control the first insulation resistance region to be separated from the second insulation resistance region;
   receive the insulation resistance value of at least one of the separated first and second insulation resistance regions from the insulation resistance measuring unit; and
   determine in which of the first or second insulation resistance regions the insulation breakdown occurs.

12. A method of measuring insulation resistance, the method comprising:
 connecting or separating, through a relay unit, a first insulation resistance region and a second insulation resistance region among a plurality of insulation resistance regions;
 measuring, through an insulation resistance measuring unit, an insulation resistance value of the connected first and second insulation resistance regions, an insulation resistance value of the first insulation resistance region separate from the second insulation resistance region, and an insulation resistance value of the second insulation resistance region separate from the first insulation resistance region; and
 receiving, through a control unit, the insulation resistance value of the connected first and second insulation resistance regions from the insulation resistance measuring unit;
 in response to detection of an insulation breakdown in the connected first and second insulation resistance regions based on the insulation resistance value of the connected first and second insulation resistance regions:
  controlling, through the control unit, the relay unit to separate the first insulation resistance region from the second insulation resistance region;
  receiving, through the control unit, the insulation resistance value of at least one of the separated first and second insulation resistance regions from the insulation resistance measuring unit; and
  determining, through the control unit, in which of the first or second insulation resistance regions the insulation breakdown occurs.

13. The method of claim 12, further comprising:
 connecting or separating, by an insulation resistance connecting unit, the second insulation region and a third insulation resistance region among the plurality of insulation resistance regions, and
 determining, through the control unit, in which of the first, second or third insulation resistance regions the insulation breakdown occurs in response to detection of an insulation breakdown in the plurality of insulation resistance regions based on one or more insulation resistance values received from the insulation resistance measuring unit.

14. The method of claim 13, further comprising, connecting, through the control unit, the plurality of insulation resistance regions to one another by controlling the relay unit and the insulation resistance connecting unit until it is determined in which of the plurality of insulation resistance regions the insulation breakdown occurs.

15. The method of claim 13, further comprising, in response to detection of an insulation breakdown in the plurality of insulation resistance regions based on one or more insulation resistance values received from the insulation resistance measuring unit: connecting, through the control unit, the first insulation resistance region and the second insulation resistance region by controlling the relay unit;
- separating, through the control unit, the third insulation resistance region and the second insulation resistance region by controlling the insulation resistance connecting unit;
- receiving, through the control unit, the insulation resistance values for the first insulation resistance region and the second insulation resistance region from the insulation resistance measuring unit; and
- determining, through the control unit, whether the insulation breakdown occurs in the second insulation resistance region based on the insulation resistance values for the first insulation resistance region and the second insulation resistance region.

16. The method of claim 15, further comprising, in response to a determination that the insulation breakdown does not occur in the second insulation resistance region:
- connecting, through the control unit, the first insulation resistance region, the second insulation resistance region, and the third insulation resistance region to one another by controlling the relay unit and the insulation resistance connecting unit,
- receiving, through the control unit, the insulation resistance value for the connected first, second and third insulation resistance regions from the insulation resistance measuring unit; and
- determining, through the control unit, whether the insulation breakdown occurs in the third insulation resistance region based on the insulation resistance value for the connected first, second and third insulation resistance regions.

* * * * *